(12) United States Patent
Wu et al.

(10) Patent No.: US 11,360,709 B1
(45) Date of Patent: Jun. 14, 2022

(54) GATE SIGNAL CONTROL CIRCUIT FOR DDR MEMORY SYSTEM

(71) Applicant: FARADAY TECHNOLOGY CORPORATION, Hsinchu (TW)

(72) Inventors: Hong-Yi Wu, Hsinchu (TW); Sivaramakrishnan Subramanian, Hsinchu (TW); Sridhar Cheruku, Hsinchu (TW); Ko-Ching Chao, Hsinchu (TW)

(73) Assignee: FARADAY TECHNOLOGY CORPORATION, Hsinchu (TW)

( * ) Notice: Subject to any disclaimer, the term of this patent is extended or adjusted under 35 U.S.C. 154(b) by 63 days.

(21) Appl. No.: 16/953,549

(22) Filed: Nov. 20, 2020

(51) Int. Cl.
*G06F 3/06* (2006.01)
*G06F 13/16* (2006.01)
*G11C 11/4076* (2006.01)

(52) U.S. Cl.
CPC .......... *G06F 3/0659* (2013.01); *G06F 3/0604* (2013.01); *G06F 3/0673* (2013.01); *G06F 13/1668* (2013.01); *G11C 11/4076* (2013.01)

(58) Field of Classification Search
CPC .... G06F 3/0659; G06F 3/0604; G06F 3/0673; G06F 13/1668; G11C 11/4076
See application file for complete search history.

(56) References Cited

U.S. PATENT DOCUMENTS

| 9,524,255 B2 | 12/2016 | Zhu et al. | |
|---|---|---|---|
| 2013/0297961 A1* | 11/2013 | Zhu | G06F 1/04 713/401 |
| 2015/0124539 A1* | 5/2015 | Iijima | G11C 7/1093 365/193 |
| 2020/0321044 A1* | 10/2020 | Gopalan | G11C 11/4096 |

\* cited by examiner

*Primary Examiner* — Gary W. Cygiel
(74) *Attorney, Agent, or Firm* — WPAT, PC

(57) ABSTRACT

A gate signal control circuit of a DDR memory system includes a comparing circuit, a flag generator and a signal generator. The comparing circuit receives a first data strobe signal and a second data strobe signal, and generates an internal data strobe signal. The flag generator receives a physical layer clock signal and a read enable signal, and generates plural flag signals. The signal generator receives the internal data strobe signal and the plural flag signal, and generates a gate signal. When plural read commands are issued, the flag generator sets the flag signals according to the physical layer clock signal and the read enable signal. When a read data is received, the signal generator opens the gate signal according to a preamble, and the signal generator samples the plural flag signals to determine the timing of closing the gate signal.

12 Claims, 7 Drawing Sheets

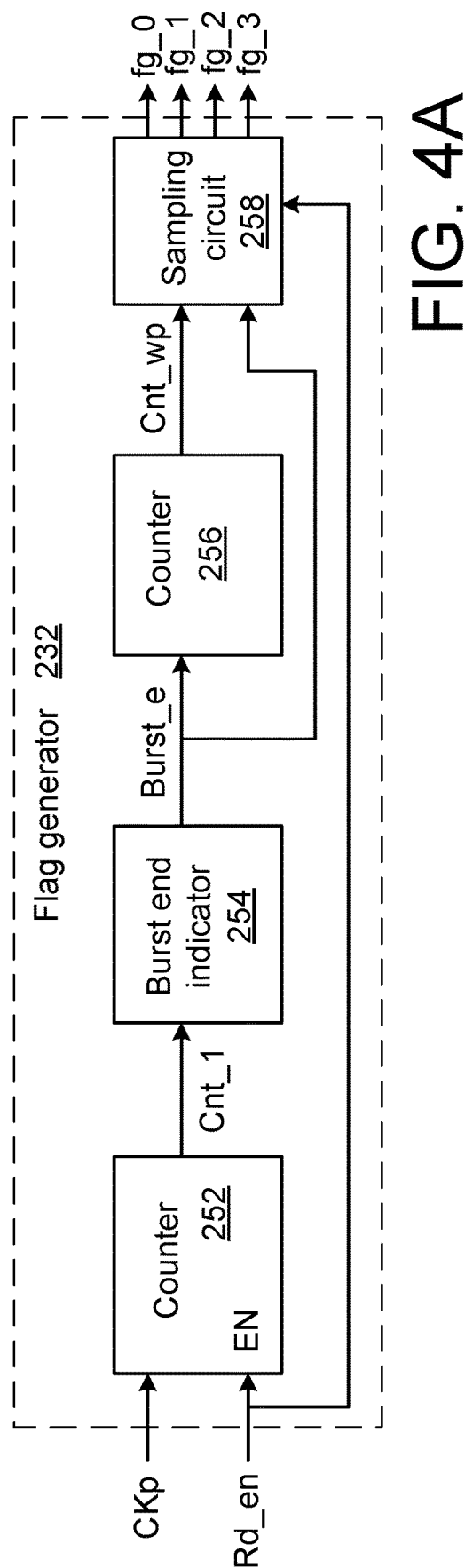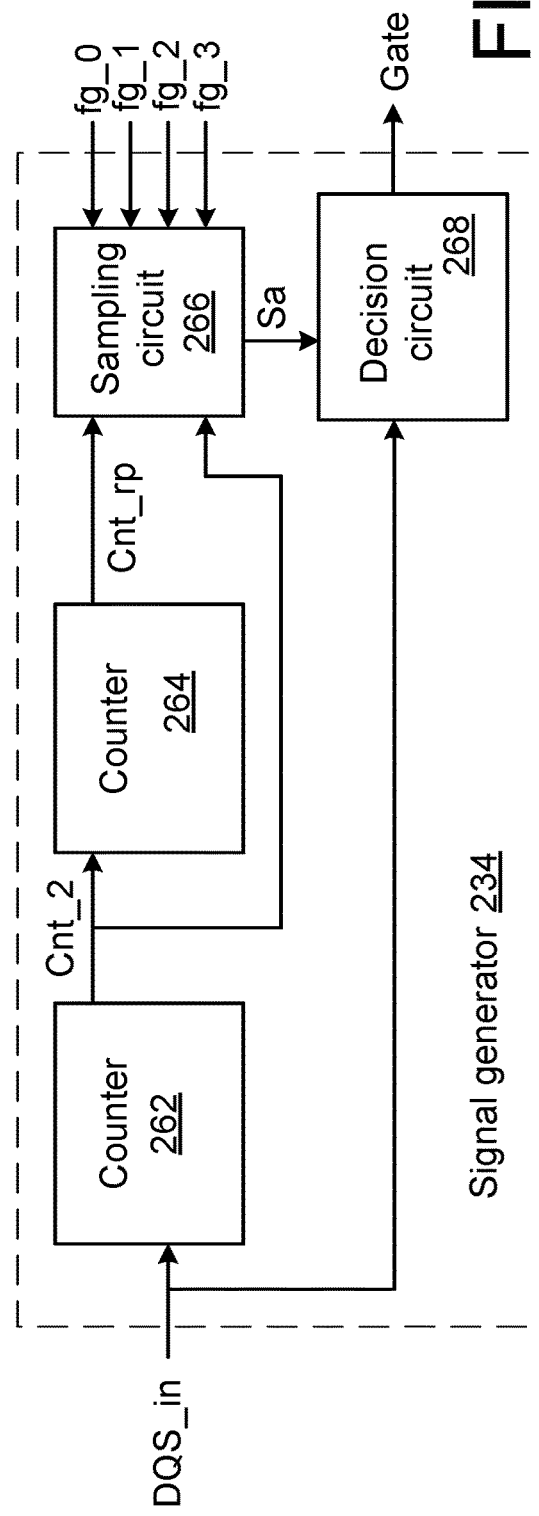

GATE SIGNAL CONTROL CIRCUIT FOR DDR MEMORY SYSTEM

FIELD OF THE INVENTION

The present invention relates to a control circuit for a memory system, and more particularly to a gate signal control circuit for a DDR memory system.

BACKGROUND OF THE INVENTION

As known, a double data rate memory (also abbreviated as DDR memory) is one of the common memories. FIG. 1A is a schematic block diagram illustrating a conventional DDR memory system. As shown in FIG. 1A, the DDR memory system 100 comprises a processing circuit 110 and a DDR memory 120.

The processing circuit 110 comprises a memory controller 112 and a physical layer (PHY) circuit 114. The PHY circuit 114 and the DDR memory 120 exchange various signals through a memory bus 122. A DDR PHY Interface 116, which is also referred as a DFI interface, is connected between the memory controller 112 and the PHY circuit 114. Consequently, various signals can be transmitted between the memory controller 112 and the PHY circuit 114 through the PHY Interface 116. The signals to be transmitted through the memory bus 122 at least contain a data signal DQ, a first data strobe signal DQS_t and a second data strobe signal DQS_c. The phase difference between the first data strobe signal DQS_t and the second data strobe signal DQS_c is 180 degrees.

After the memory controller 112 issues a read command to the PHY circuit 114 through the PHY Interface 116, the read command is transmitted to the DDR memory 120 through the PHY circuit 114 and the memory bus 122. Then, according to the read command, the DDR memory 120 generates a read data. The read data is transmitted to the PHY circuit 114 through the memory bus 122.

Generally, there is a latency between the time point of issuing the read command and the time point of receiving the read data. For example, the PHY circuit 114 comprises a digital circuit and an analog circuit (not shown). Consequently, a digital latency and an analog latency are generated. Moreover, plural layout traces of the memory bus 122 are formed on a circuit board. The PHY circuit 114 and the DDR memory 120 are fixed on the circuit board and connected between these layout traces. Consequently, a package/board latency is generated. Moreover, the DDR memory 120 has a read latency between the time point of receiving the read command and the time point of generating the read data. This read latency is defined in the specifications of the DDR memory 120, for example the JEDEC specification.

FIG. 1B is a schematic timing waveform diagram illustrating associated signals in a read process of the conventional DDR memory system. At the time point t1, the memory controller 112 issues a read command. After the above latencies and at the time point t2, the PHY circuit 114 reads the read data from the DDR memory 120. Consequently, at the time point t2, a gate signal Gate is opened by the PHY circuit 114. That is, the gate signal Gate is switched from a low level state to a high level state to indicate that an effective data region starts. Meanwhile, the first data strobe signal DQS_t and the second data strobe signal DQS_c are activated. According to the first data strobe signal DQS_t and the second data strobe signal DQS_c, the data signal DQ (not shown) in the memory bus 122 is latched by the PHY circuit 114.

At the time point t3, the gate signal Gate is closed by the PHY circuit 114. That is, the gate signal Gate is switched from the high level state to the low level state to indicate that the effective data region ends. Meanwhile, the process of transmitting the read data is completed.

Generally, the gate signal Gate is a signal for controlling the PHY circuit 114 to receive the read data. If the timing of opening or closing the gate signal Gate is improper, the PHY circuit 114 is unable to receive the accurate read data and unable to transmit the accurate read data to the memory controller 112.

In case that the latency of the DDR memory system 100 is accurately realized, the purpose of avoid missing all pulses of the first data strobe signal DQS_t and the second data strobe signal DQS_c can be achieved.

During the initialization of the DDR memory system 100, it is necessary to train the timing of opening the gate signal Gate and the timing of closing the gate signal Gate in order to realize the effective data region.

In case that the DDR memory system 100 is in the normal working state after the training process, the gate signal Gate can be opened or closed accurately. Consequently, the data signal DQ (not shown) can be latched as the read data by the PHY circuit 114 according to the pulses of the first data strobe signal DQS_t and the second data strobe signal DQS_c.

However, the latency of the DDR memory system 100 may be varied with the change of the process, voltage and/or temperature. That is, the time point t2 and the time point t3 may be varied continuously. Consequently, the effective data region is subjected to the change.

For surely receiving the read data, the processing circuit 110 has to periodically train the gate signal Gate. The process of periodically training the gate signal Gate may influence the bandwidth of the DDR memory system 100.

The JEDEC specification also has the following contents. When the DDR memory 120 starts to transmit data, the first pulse of the first data strobe signal DQS_t is a preamble. According to the preamble of the first data strobe signal DQS_t, the PHY circuit 114 opens the gate signal Gate.

FIG. 1C is another schematic timing waveform diagram illustrating associated signals in a read process of the conventional DDR memory system. The PHY circuit 114 generates an internal data strobe signal DQS_diff according to the first data strobe signal DQS_t and the second data strobe signal DQS_c.

At the time point t1, the memory controller 112 issues a read command. After the above latencies and at the time point t2, the PHY circuit 114 reads the read data from the DDR memory 120.

In the time interval between the time point t2 and the time point t4, the first pulse of the first data strobe signal DQS_t corresponding to the preamble is generated. At the time point t3 corresponding to the falling edge of the first data strobe signal DQS_t, the PHY circuit 114 opens the gate signal Gate. That is, the gate signal Gate is switched from a low level state to a high level state to indicate that an effective data region starts.

Then, the PHY circuit 114 counts the pulse number of the internal data strobe signal DQS_diff and determines the timing of closing the gate signal Gate according to the pulse number of the internal data strobe signal DQS_diff. For example, the time period of three pulses of the internal data strobe signal DQS_diff is required for reading one read data.

Consequently, after the gate signal Gate is opened, the PHY circuit 114 counts three pulses of the internal data strobe signal DQS_diff. At the time point t5 corresponding to the falling edge of the third pulse of the internal data strobe signal DQS_diff to indicate that the effective data region ends. Obviously, the method of controlling the gate signal Gate according to the result of detecting the preamble is not influenced by the latency. Consequently, the process of training the gate signal Gate can be omitted.

The method of FIG. 1C is only applied to the single read command, but not suitable to the back-to-back read process. If the memory controller 112 issues consecutive read commands, plural read data will be transmitted back from the DDR memory 120 consecutively. However, the use of the method of FIG. 1C to control the gate signal Gate may result in a data loss problem.

FIG. 2 is a schematic timing waveform diagram illustrating associated signals in a back-to-back read process of the conventional DDR memory system. Similarly, an internal data strobe signal DQS_diff is generated by the PHY circuit 114 according to the first data strobe signal DQS_t and the second data strobe signal DQS_c.

At the time point t1, the memory controller 112 issues two consecutive read commands. After the above latencies and at the time point t2, the PHY circuit 114 reads the read data from the DDR memory 120. In the time interval between the time point t2 and the time point t3, the preamble is generated. In the time interval between the time point t3 and the time point t5, the DDR memory 120 transmits the first read data. After the time point t5, the DDR memory 120 transmits the second read data.

In the time interval between the time point t2 and the time point t3, the preamble is generated, and the PHY circuit 114 opens the gate signal Gate at the time point corresponding to the falling edge of the first data strobe signal DQS_t. Meanwhile, an effective data region starts.

After the gate signal Gate is opened, the PHY circuit 114 counts three pulses of the internal data strobe signal DQS_diff. At the time point t4, the gate signal Gate is closed to indicate that the effective data region ends. However, at the time point t5, the pulse of the first data strobe signal DQS_t is erroneously judged as a new preamble by the PHY circuit 114. Consequently, at the time t6, the gate signal Gate is opened again. In other words, the time period between the time point t4 and the time point t6 is erroneously judges as an ineffective data region.

Obviously, in the time period between the time point t4 and the time point t6, the second read data is being transmitted. However, since the gate signal Gate is closed, the data signal DQ (not shown) in the memory bus 122 cannot be latched by the PHY circuit 114 at the time point t5. Due to the erroneous operation of the gate signal Gate, the second read data is lost.

SUMMARY OF THE INVENTION

An embodiment of the present invention provides a gate signal control circuit for a DDR memory system. The DDR memory system includes a memory controller and a DDR memory. The gate signal control circuit includes a comparing circuit, a flag generator and a signal generator. The comparing circuit is connected with the DDR memory. The comparing circuit receives a first data strobe signal and a second data strobe signal, and generates an internal data strobe signal. The flag generator is connected with the memory controller. The flag generator receives a physical layer clock signal and a read enable signal, and generates plural flag signals. The signal generator is connected with the flag generator and the comparing circuit. The signal generator receives the internal data strobe signal and the plural flag signal, and generates a gate signal. When the memory controller issues plural read commands, the flag generator sets the plural flag signals according to the physical layer clock signal and the read enable signal. When the gate signal control circuit receives a read data from the DDR memory, the signal generator opens the gate signal according to a preamble, and the signal generator samples the plural flag signals to determine the timing of closing the gate signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4A is a schematic circuit block diagram illustrating the flag generator as shown in FIG. 3A;

FIG. 4B is a schematic circuit block diagram illustrating the signal generator as shown in FIG. 3A;

DETAILED DESCRIPTION OF PREFERRED EMBODIMENTS

Figure 1A:
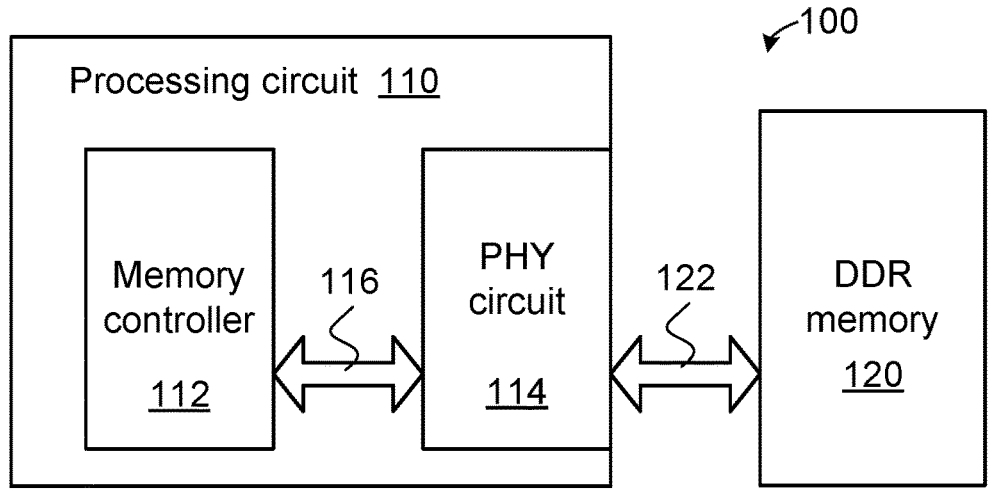
FIG. 1A (prior art) is a schematic block diagram illustrating a conventional DDR memory system.
Figure 1B:
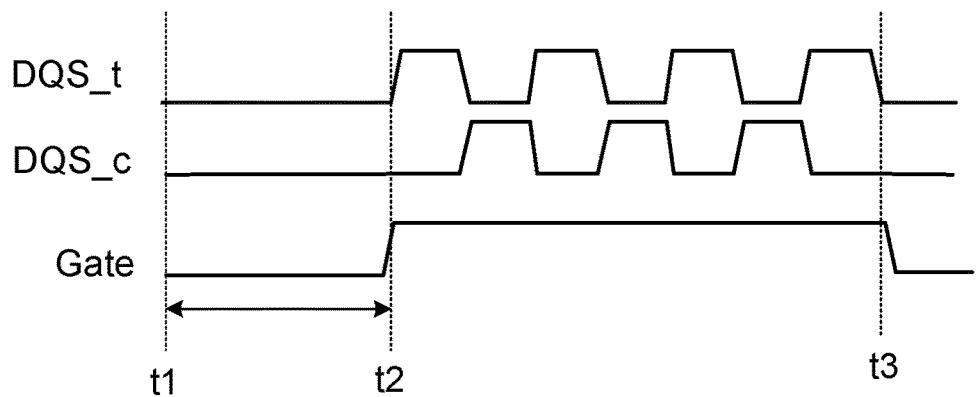
FIG. 1B (prior art) is a schematic timing waveform diagram illustrating associated signals in a read process of the conventional DDR memory system.
Figure 1C:
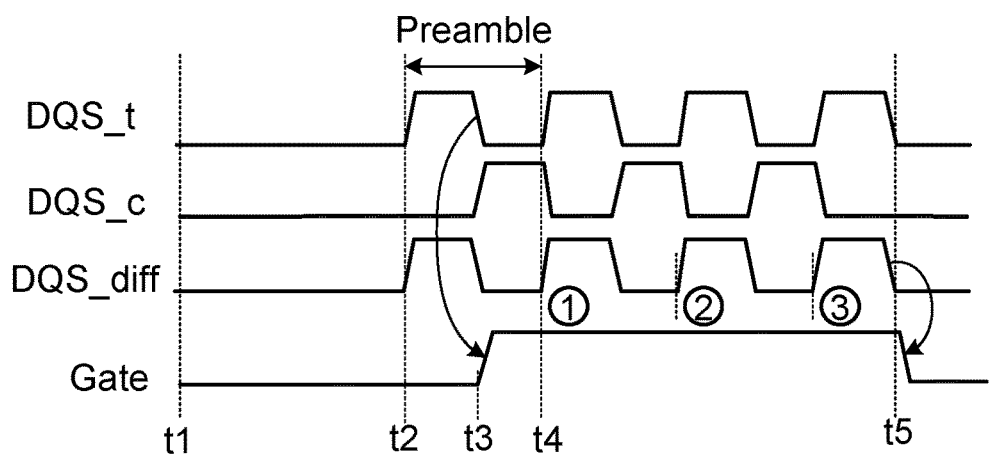
FIG. 1C (prior art) is another schematic timing waveform diagram illustrating associated signals in a read process of the conventional DDR memory system.
Figure 2:
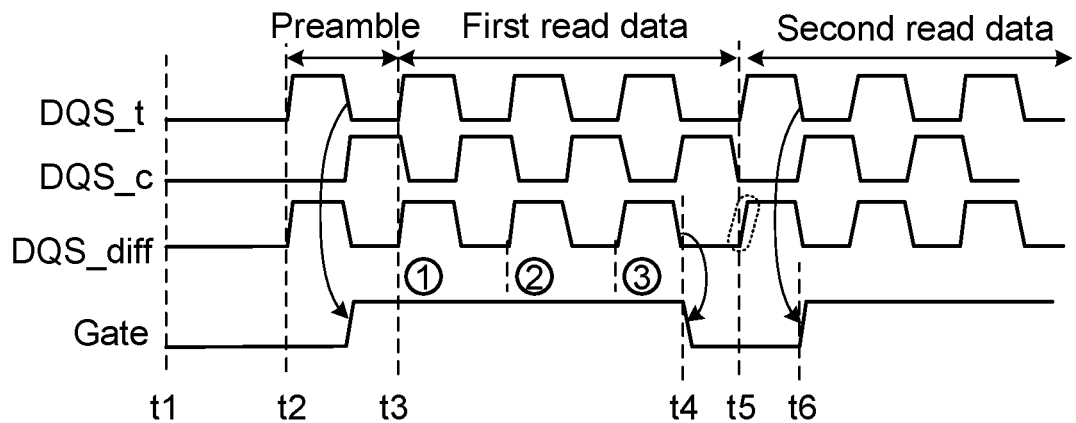
FIG. 2 (prior art) is a schematic timing waveform diagram illustrating associated signals in a back-to-back read process of the conventional DDR memory system.
Figure 3A:
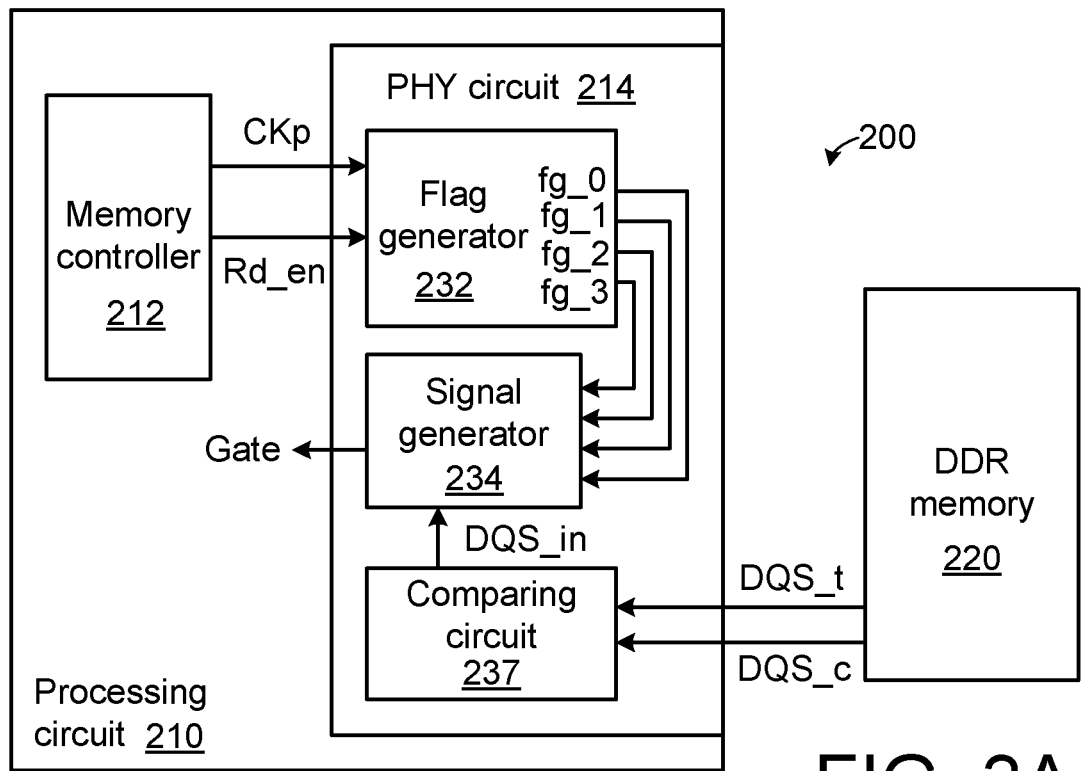
FIG. 3A is a schematic block diagram illustrating a DDR memory system according to an embodiment of the present invention.

FIG. 3A is a schematic block diagram illustrating a DDR memory system according to an embodiment of the present invention. As shown in FIG. 3A, the DDR memory system 200 comprises a processing circuit 210 and a DDR memory 220.

The processing circuit 210 comprises a memory controller 212 and a physical layer (PHY) circuit 214. The PHY circuit 214 and the DDR memory 220 exchange various signals through a memory bus. A DFI interface is connected between the memory controller 212 and the PHY circuit 214. Consequently, various signals can be transmitted between the memory controller 212 and the PHY circuit 214 through the PHY Interface. The signals to be transmitted through the memory bus at least contain a first data strobe signal DQS_t and a second data strobe signal DQS_c. The signals to be transmitted through the DFI interface contain a PHY clock signal CKp and a read enable signal Rd_en. The phase difference between the first data strobe signal DQS_t and the second data strobe signal DQS_c is 180 degrees. The frequencies of the PHY clock signal CKp, the first data strobe signal DQS_t and the second data strobe signal DQS_c are identical.

The PHY circuit 214 comprises a gate signal control circuit. The gate signal control circuit comprises a flag generator 232, a signal generator 234 and a comparing circuit 237. The comparing circuit 237 receives the first data strobe signal DQS_t and the second data strobe signal DQS_c and generates an internal data strobe signal DQS_in to the signal generator 234.

Figure 3B:
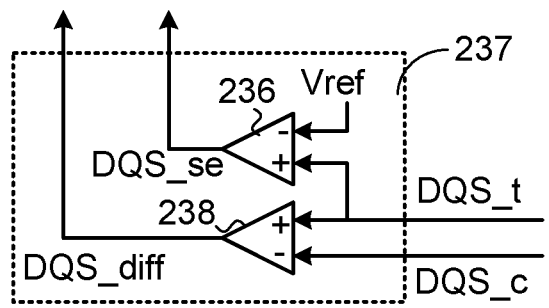
FIG. 3B is a schematic circuit diagram illustrating an example of the comparing circuit as shown in FIG. 3A.

FIG. 3B is a schematic circuit diagram illustrating an example of the comparing circuit as shown in FIG. 3A. The comparing circuit 237 comprises two comparators 236 and 238. The positive input terminal of the comparator 236 receives the first data strobe signal DQS_t. The negative input terminal of the comparator 236 receives a reference voltage Vref. The output terminal of the comparator 236 generates a third data strobe signal DQS_se. The positive input terminal of the comparator 238 receives the first data strobe signal DQS_t. The negative input terminal of the comparator 238 receives the second data strobe signal DQS_c. The output terminal of the comparator 238 generates a fourth data strobe signal DQS_diff.

The waveform of the third data strobe signal DQS_se and the waveform of the fourth data strobe signal DQS_diff are similar to the waveform of the first data strobe signal DQS_t. When the preamble of the first data strobe signal DQS_t is generated, the preamble of the third data strobe signal DQS_se and the preamble of the fourth data strobe signal DQS_diff are generated. Consequently, the processing circuit 210 can judge whether the preamble of the first data strobe signal DQS_t, the third data strobe signal DQS_se or the fourth data strobe signal DQS_diff is generated.

In accordance with the present invention, one of the third data strobe signal DQS_se and the fourth data strobe signal DQS_diff is used as the internal data strobe signal DQS_in. The internal data strobe signal DQS_in is transmitted to the signal generator 234. In another embodiment, the comparing circuit 237 comprises the comparator 236 only. The comparator 236 generates the third data strobe signal DQS_se. The third data strobe signal DQS_se is used as the internal data strobe signal DQS_in and transmitted to the signal generator 234. In a further embodiment, the comparing circuit 237 comprises the comparator 238 only. The comparator 238 generates the fourth data strobe signal DQS_diff. The fourth data strobe signal DQS_diff is used as the internal data strobe signal DQS_in and transmitted to the signal generator 234.

Moreover, the flag generator 232 receives the PHY clock signal CKp and the read enable signal Rd_en and generates four flag signals fg_0~fg_3. The signal generator 234 receives the four flag signals fg_0~fg_3 and the internal data strobe signal DQS_in and generates the gate signal Gate.

FIG. 4A is a schematic circuit block diagram illustrating the flag generator as shown in FIG. 3A. The flag generator 232 comprises two counters 252 and 256, a burst end indicator 254 and a sampling circuit 258.

A counting terminal of the counter 252 receives the PHY clock signal CKp. An enable terminal of the counter 252 receives the read enable signal Rd_en. An output terminal of the counter 252 generates a count value Cnt_1. When the read enable signal Rd_en is activated, the counter 252 starts to count the pulse number of the PHY clock signal CKp.

For example, the count value Cnt_1 of the counter 252 may be changed between M different values from a first initial value to a first target value. After the count value Cnt_1 of the counter 252 is changed from the first initial value to the first target value, the count value Cnt_1 of the counter 252 is restored to the first initial value. For example, the counter 252 is a ring counter or an up counter.

In case that the counter 252 is the up counter, the counter 252 counts the count value Cnt_1 upwardly at an increment of one whenever the clock cycle increases. After the counter 252 is enabled, the counter 252 counts the count value Cnt_1 upwardly from the first initial value to the first target value. When the count value Cnt_1 reaches the first target value, the counter 252 is reset. Consequently, the count value Cnt_1 is changed to the first initial value, and the counter 252 counts the count value Cnt_1 upwardly according to the PHY clock signal CKp.

In an embodiment, the time period of processing one read data is equal to the time period of eight cycles of the PHY clock signal CKp. Consequently, the counter 252 generates 8 different count values (i.e., M=8) from 0 (i.e., the first initial value) to 7 (i.e., the first target value).

The burst end indicator 254 receives the count value Cnt_1 and generates a burst end signal Burst_e. When the count value Cnt_1 is equal to the first target value, the burst end signal Burst_e is activated for one clock cycle by the burst end indicator 254. That is, when the count value Cnt_1 is 7, the burst end signal Burst_e is switched to the high level state in the next clock cycle by the burst end indicator 254.

The counter 256 receives and counts the burst end signal Burst_e and generates a write pointer Cnt_wp. The write pointer Cnt_wp of the counter 256 may be changed between N different values from a second initial value to a second target value. After the write pointer Cnt_wp of the counter 256 is changed from the second initial value to the second target value, the write pointer Cnt_wp of the counter 256 is restored to the second initial value. For example, the counter 256 is a ring counter or an up counter.

In case that the counter 256 is the up counter, the counter 256 counts the write pointer Cnt_wp upwardly at an increment of one whenever the burst end signal Burst_e is activated. In addition, the counter 256 counts the write pointer Cnt_wp upwardly from the second initial value to the second target value. When the write pointer Cnt_wp of the counter 256 reaches the second target value, the counter 256 is reset. Consequently, the write pointer Cnt_wp is changed to the second initial value, and the counter 256 counts the write pointer Cnt_wp upwardly according to the burst end signal Burst_e.

The sampling circuit 258 receives the burst end signal Burst_e, the write pointer Cnt_wp and the read enable signal Rd_en and generates N flag signals. When the burst end signal Burst_e is activated, the sampling circuit 258 performs a sampling action. While the sampling action is performed, the sampling circuit 258 samples the read enable signal Rd_en and sets the flag signal of the corresponding write pointer Cnt_wp according to the sampling result.

For example, if the read enable signal Rd_en is in a first level state and the write pointer Cnt_wp is "0" while the sampling action is performed, the flag signal fg_0 is set as the first level state by the sampling circuit 258. Whereas, if the read enable signal Rd_en is in a second level state and the write pointer Cnt_wp is "0" while the sampling action is performed, the flag signal fg_0 is set as the second level state by the sampling circuit 258. For example, the first level state is a low level state, and the second level state is a high level state.

Similarly, if the read enable signal Rd_en is in the first level state and the write pointer Cnt_wp is "1" while the sampling action is performed, the flag signal fg_1 is set as the first level state by the sampling circuit 258. Whereas, if the read enable signal Rd_en is in the second level state and the write pointer Cnt_wp is "1" while the sampling action is performed, the flag signal fg_1 is set as the second level state by the sampling circuit 258. The methods of setting the flag signals fg_2 and fg_3 are similar.

FIG. 4B is a schematic circuit block diagram illustrating the signal generator as shown in FIG. 3A. The signal generator 234 comprises two counters 262 and 264, a sampling circuit 266 and a decision circuit 268.

A counting terminal of the counter 262 receives the internal data strobe signal DQS_in. An output terminal of the counter 262 generates a count value Cnt_2. The counter 262 can count the pulse number of the internal data strobe signal DQS_in.

Especially, when the counter 262 is enabled, the count value Cnt_2 is maintained at a cleared value. When a preamble is generated, the counter 262 counts the count value Cnt_2 upwardly from a third initial value to a third target value according to the internal data strobe signal DQS_in. Then, the count value Cnt_2 of the counter 262 is determined as the cleared value or the third initial value according to the contents of the flag signals fg_0~fg_3.

In case that the counter 262 is the up counter, the count value Cnt_2 is maintained at the cleared value when the counter 262 is enabled. When the preamble is detected, the counter 262 starts to count the pulse number of the internal data strobe signal DQS_in. In addition, the count value Cnt_2 is changed from the cleared value to the third initial value and gradually increased to the third target value. When the count value Cnt_2 reaches the third target value, the counter 262 is reset. Consequently, the count value Cnt_2 is reset as the third initial value or the cleared value. In addition, the counter 262 counts the count value Cnt_2 to the third target value according to the internal data strobe signal DQS_in.

In an embodiment, the counter 262 generates X different values including the cleared value and the values from the third initial value to the third target value. For example, the counter 262 generates 9 different count values Cnt_2 (i.e., X=9). The cleared value is 0. The third initial value is 1. The third target value is 8.

The structure of the counter 264 is similar to that of the counter 256. The counter 264 receives the count value Cnt_2 and counts the occurrence number of the third target value in the count value Cnt_2. Moreover, the counter 264 generates a read pointer Cnt_rp according to the occurrence number of the third target value. For example, the read pointer Cnt_rp of the counter 264 may be changed between the N different values from the second initial value to the second target value. After the read pointer Cnt_rp of the counter 264 is changed from the second initial value to the second target value, the read pointer Cnt_rp of the counter 264 is restored to the second initial value. For example, the counter 264 is a ring counter or an up counter.

In case that the counter 264 is the up counter, the counter 264 counts the read pointer Cnt_rp upwardly at an increment of one whenever the read pointer Cnt_rp reaches the third target value. In addition, the counter 264 counts the read pointer Cnt_rp upwardly from the second initial value to the second target value. When the read pointer Cnt_rp of the counter 264 reaches the second target value, the counter 264 is reset. Consequently, the read pointer Cnt_rp is changed to the second initial value, and the counter 264 counts the read pointer Cnt_rp upwardly according to the count value Cnt_2. For example, the counter 264 generates four different values (i.e., N=4). The second initial value is 0. The second target value is 3.

The sampling circuit 266 receives the count value Cnt_2, the four flag signals fg_0~fg_3 and the read pointer Cnt_rp, and a sampling signal Sa. While the sampling action is performed, the sampling circuit 266 samples one of the four flag signals fg_0~fg_3 according to the read pointer Cnt_rp and generates the sampling signal Sa. Moreover, according to the sampling signal Sa, the count value Cnt_2 of the counter 262 is reset as the third initial value or the cleared value.

For example, if the read pointer Cnt_rp is "0" while the sampling action is performed, the sampling circuit 266 samples the flag signal fg_0 and the sampling result is served as the sampling signal Sa.

Similarly, if the read pointer Cnt_rp is "1" while the sampling action is performed, the sampling circuit 266 samples the flag signal fg_1 and the sampling result is served as the sampling signal Sa. The methods of sampling the flag signals fg_2 and fg_3 are similar. Moreover, if the sampling signal Sa is in the low level state, the count value Cnt_2 of the counter 262 is reset as the cleared value. Whereas, if the sampling signal Sa is in the high level state, the count value Cnt_2 of the counter 262 is reset as the third initial value.

The decision circuit 268 receives the internal data strobe signal DQS_in and the sampling signal Sa and generates the gate signal Gate. In an embodiment, the decision circuit 268 determines the timing of opening the gate signal Gate according to the preamble in the internal data strobe signal DQS_in. Moreover, the decision circuit 268 determines whether the gate signal Gate is continuously opened or closed according to the sampling signal Sa.

Figure 5A:
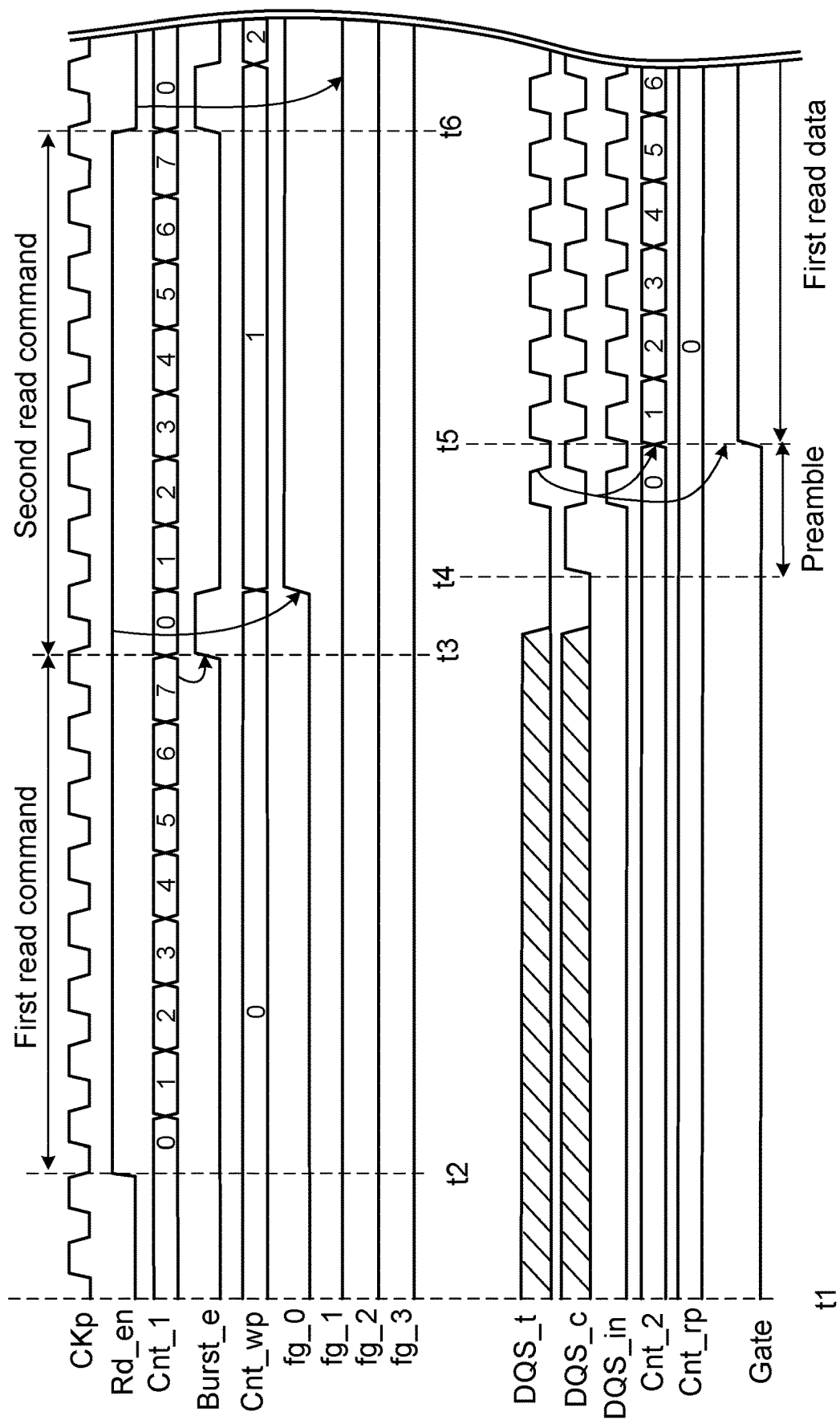
FIGS. 5A and 5B are schematic timing waveform diagrams illustrating associated signals in a back-to-back read process of the DDR memory system according to the embodiment of the present invention.
Figure 5B:
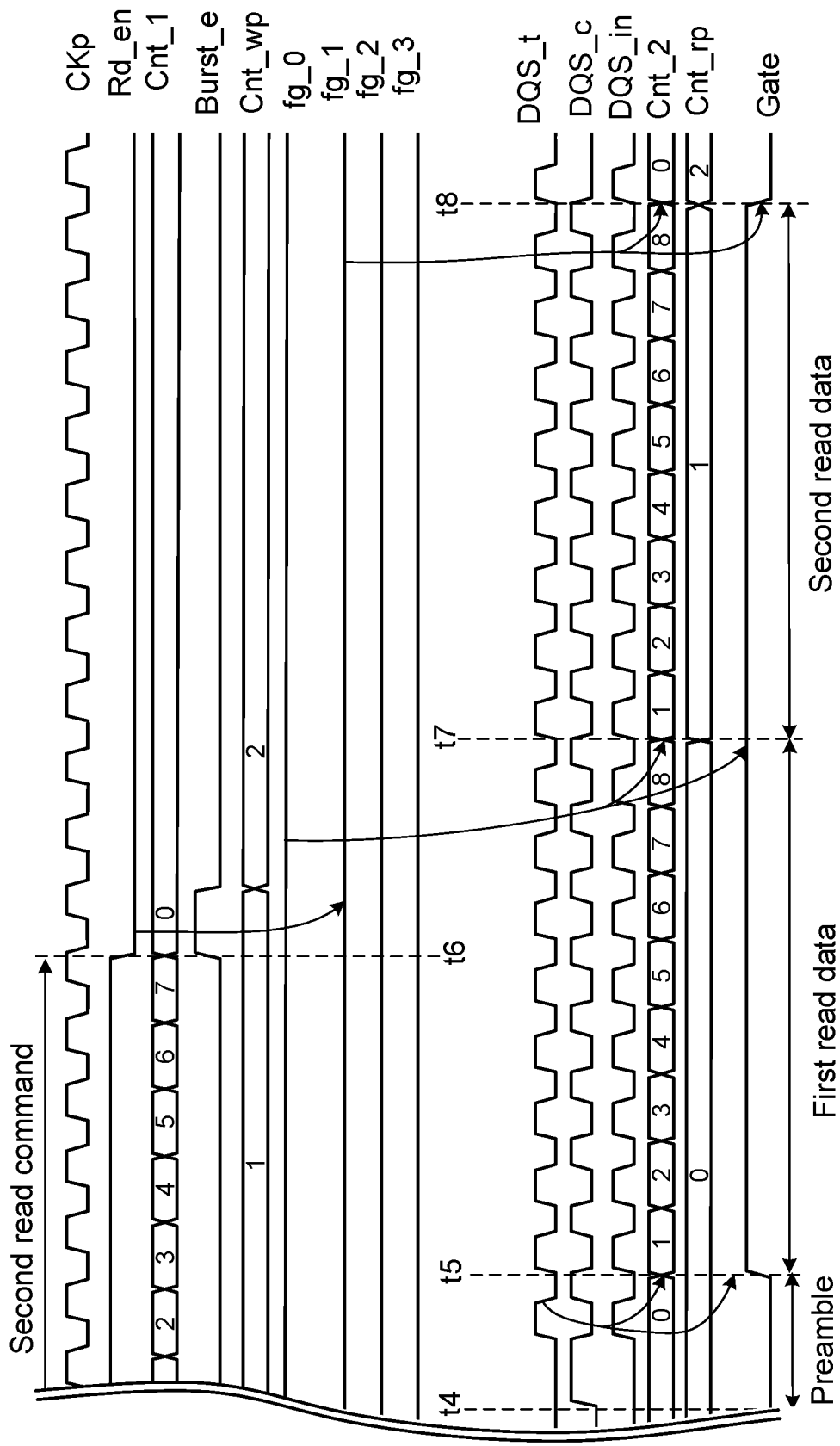

FIGS. 5A and 5B are schematic timing waveform diagrams illustrating associated signals in a back-to-back read process of the DDR memory system according to the embodiment of the present invention. That is, the memory controller 212 issues consecutive read commands.

When the DDR memory system 200 is enabled, the count value Cnt_1 of the counter 252 is set as the first initial value "0", the write pointer Cnt_wp of the counter 256 is set as the second initial value "0", the count value Cnt_2 of the counter 262 is set as the cleared value "0", and the read pointer Cnt_rp of the counter 264 is set as the second initial value "0". In addition, all of the gate signal Gate, the burst end signal Burst_e and the four flag signals fg_0~fg_3 are in the low level state.

At the time point t1, the memory controller 212 issues two consecutive read commands. In the time interval between the time point t2 and the time point t3, the PHY circuit 214 processes and transmits the first read command. In the time interval between the time point t3 and the time point t6, the PHY circuit 214 processes and transmits the second read command. That is, in the time interval between the time point t2 and the time point t6, the read enable signal Rd_en is activated. That is, the read enable signal Rd_en is in the high level state.

At the time point t2, the read enable signal Rd_en is switched to the high level state and the counter 252 is enabled. The counter 252 counts the count value Cnt_1 upwardly from the first initial value "0". When the count value Cnt_1 reaches the first target value "7", the counter 252 is reset. Consequently, at the time point t3, the count value Cnt_1 is reset as the first initial value "0". In addition, a next clock cycle of the burst end signal Burst_e is activated by the burst end indicator 254.

Please refer to FIG. 5A again. When the burst end signal Burst_e is activated, the write pointer Cnt_wp is the second initial value "0". Consequently, the sampling circuit 258 samples the read enable signal Rd_en in the high level state and sets the flag signal fg_0 as the high level state. After the burst end signal Burst_e is inactivated, the write pointer Cnt_wp is increased to "1" by the counter 256.

At the time point t6, the count value Cnt_1 is reset as the first initial value "0", and the next clock cycle of the burst end signal Burst_e is activated by the burst end indicator 254. Moreover, when the burst end signal Burst_e is activate, the write pointer Cnt_wp is "1". Consequently, the sampling circuit 258 samples the read enable signal Rd_en in the low level state and sets the flag signal fg_1 as the low level state. After the burst end signal Burst_e is inactivated, the write pointer Cnt_wp is increased to "2" by the counter 256.

Please refer to FIG. 5B. In the time interval between the time point t4 and the time point t5, the preamble of the first data strobe signal DQS_t occurs. In the time interval between the time point t5 and the time point t7, the first read data is transmitted back from the DDR memory 220. In the time interval between the time point t7 and the time point t8, the second read data is transmitted back from the DDR memory 220.

In an embodiment, the decision circuit 268 confirms the preamble according to the internal data strobe signal DQS_in. Moreover, at the time point t5, the gate signal Gate is opened. That is, the gate signal Gate is switched from the low level state to the high level state to indicate that an effective data region starts. At the same time, the count value Cnt_2 of the counter 262 is gradually increased from the cleared value "0" to the third initial value "1" and continuously increased. When the value Cnt_2 of the counter 262 reaches the third target value "8", the counter 262 is reset. In addition, the read pointer Cnt_rp of the counter 264 is gradually increased from the second initial value "0" to "1".

When the value Cnt_2 reaches the third target value "8", the sampling circuit 266 performs the sampling action. As shown in FIG. 5B, the sampling circuit 266 performs the sampling action at the time point t7. Since the read pointer Cnt_rp is "0", the sampling circuit 266 samples the flag signal fg_0 in the high level state. Moreover, at the time point t7, the gate signal Gate is continuously maintained in the high level state under control of the sampling circuit 266. Since the sampling circuit 266 samples the flag signal fg_0 in the high level state, the count value Cnt_2 of the counter 262 is reset as the third initial value "1" at the time point t7.

Similarly, the sampling circuit 266 performs another sampling action at the time point t8. Since the read pointer Cnt_rp, the sampling circuit 266 samples the flag signal fg_1 in the low level state. At the time point t8, the gate signal Gate is switched to the low level state under control of the sampling circuit 266. That is, the gate signal Gate is closed to indicates that the effective data region ends. Since the sampling circuit 266 samples the flag signal fg_1 in the low level state, the count value Cnt_2 of the counter 262 is reset as the cleared value "0" at the time point t8.

As mentioned above, the DDR memory system 200 has the following benefits. When the memory controller 212 issues the consecutive read commands, the PHY circuit 214 can maintain the gate signal Gate in the high level state in the time interval between the time point t5 and the time point t8 (i.e., the accurate effective data region). Since the two read data can be normally latched, the possibility of losing data will be minimized.

Figure 6A:
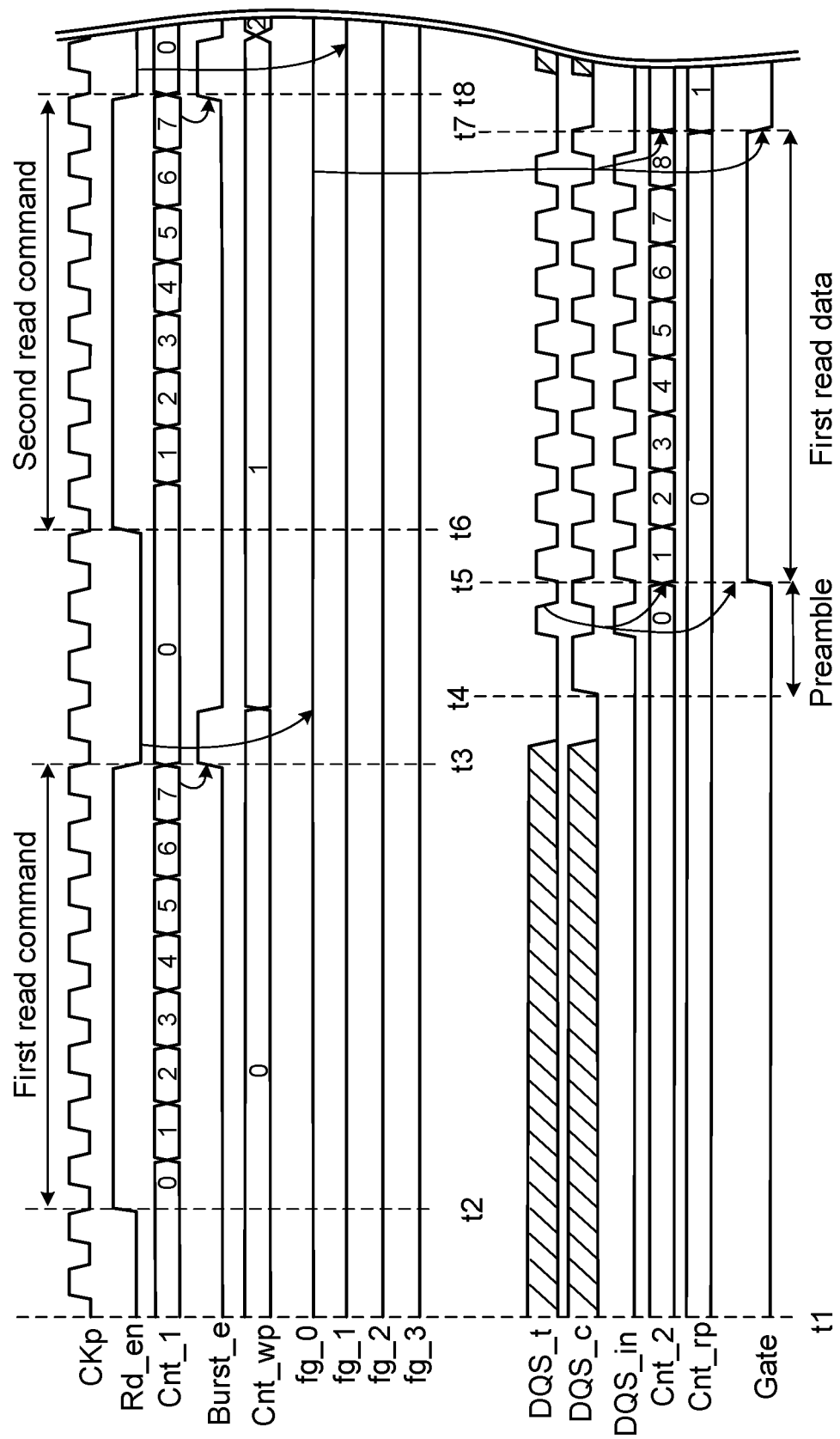
FIGS. 6A and 6B are schematic timing waveform diagrams illustrating associated signals in a non-back-to-back read process of the DDR memory system according to the embodiment of the present invention.
Figure 6B:
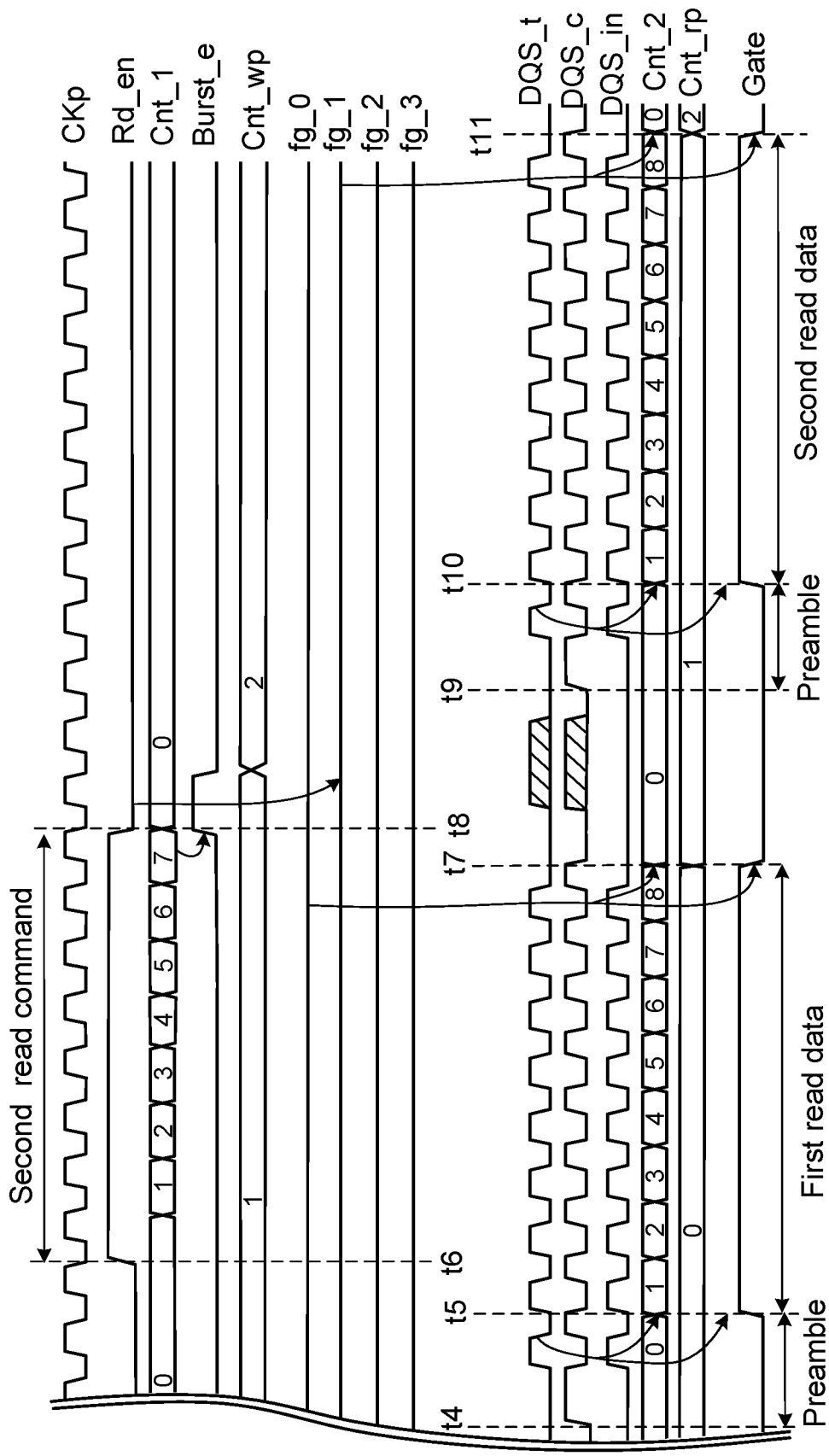

FIGS. 6A and 6B are schematic timing waveform diagrams illustrating associated signals in a non-back-to-back read process of the DDR memory system according to the embodiment of the present invention. That is, the memory controller 212 issues non-consecutive read commands At the time point t1, the memory controller 212 issues two consecutive read commands. In the time interval between the time point t2 and the time point t3, the PHY circuit 214 processes and transmits the first read command. Moreover, the read enable signal Rd_en is activated. That is, the read enable signal Rd_en is in the high level state. In the time interval between the time point t6 and the time point t8, the PHY circuit 214 processes and transmits the second read command. Moreover, the read enable signal Rd_en is activated. That is, the read enable signal Rd_en is in the high level state.

At the time point t2, the read enable signal Rd_en is switched to the high level state and the counter 252 is enabled. The counter 252 counts the count value Cnt_1 upwardly from the first initial value "0". When the count value Cnt_1 reaches the first target value "7", the counter 252 is reset. Consequently, at the time point t3, the count value Cnt_1 is reset as the first initial value "0". In addition, a next clock cycle of the burst end signal Burst_e is activated by the burst end indicator 254. Moreover, since the read enable signal Rd_en is in the low level state at the time point t3, the count value Cnt_1 is maintained at the first initial value "0".

Please refer to FIG. 6A again. When the burst end signal Burst_e is activated, the write pointer Cnt_wp is the second initial value "0". Consequently, the sampling circuit 258 samples the read enable signal Rd_en in the high level state and sets the flag signal fg_0 as the high level state. After the burst end signal Burst_e is inactivated, the write pointer Cnt_wp is increased to "1" by the counter 256.

At the time point t6, the read enable signal Rd_en is switched to the high level state and the counter 252 is enabled. The counter 252 counts the count value Cnt_1 upwardly from the first initial value "0". When the count value Cnt_1 reaches the first target value "7", the counter 252 is reset. Consequently, at the time point t8, the count value Cnt_1 is reset as the first initial value "0". In addition, a next clock cycle of the burst end signal Burst_e is activated by the burst end indicator 254. Moreover, since the read enable signal Rd_en is in the low level state at the time point t8, the count value Cnt_1 is maintained at the first initial value "0".

Please refer to FIG. 6A again. When the burst end signal Burst_e is activated, the write pointer Cnt_wp is the second initial value "1". Consequently, the sampling circuit 258 samples the read enable signal Rd_en in the low level state and sets the flag signal fg_1 as the low level state. After the burst end signal Burst_e is inactivated, the write pointer Cnt_wp is increased to "2" by the counter 256.

Please refer to FIG. 6B. In the time interval between the time point t4 and the time point t5, the preamble of the first data strobe signal DQS_t occurs. In the time interval between the time point t5 and the time point t7, the first read data is transmitted back from the DDR memory 220. In the time interval between the time point t9 and the time point t10, the preamble of the first data strobe signal DQS_t occurs. In the time interval between the time point t10 and the time point t11, the second read data is transmitted back from the DDR memory 220.

In an embodiment, the decision circuit 268 confirms the preamble according to the internal data strobe signal DQS_in. Moreover, at the time point t5, the gate signal Gate is opened. That is, the gate signal Gate is switched from the low level state to the high level state to indicate that an effective data region starts. At the same time, the count value Cnt_2 of the counter 262 is gradually increased from the cleared value "0" to the third initial value "1" and continuously increased to the third target value "8".

When the value Cnt_2 reaches the third target value "8", the sampling circuit 266 performs the sampling action. After the time point t7, the read pointer Cnt_rp of the counter 264 is gradually increased to "1". As shown in FIG. 6B, the sampling circuit 266 performs the sampling action at the time point t7. Since the read pointer Cnt_rp is "0", the sampling circuit 266 samples the flag signal fg_0 in the low level state. Moreover, at the time point t7, the gate signal Gate is switched to the low level state under control of the sampling circuit 266. That is, the gate signal Gate is closed to indicates that the effective data region ends. Since the sampling circuit 266 samples the flag signal fg_0 in the low level state, the count value Cnt_2 of the counter 262 is reset as the cleared value "0".

In the time interval between the time point t9 and the time point t10, the preamble of the first data strobe signal DQS_t occurs. Moreover, at the time point t10, the gate signal Gate is opened by the decision circuit 268. That is, the gate signal Gate is switched from the low level state to the high level state to indicate that an effective data region starts. At the same time, the count value Cnt_2 of the counter 262 is gradually increased from the cleared value "0" to the third initial value "1" and continuously increased to the third target value "8".

When the value Cnt_2 reaches the third target value "8", the sampling circuit 266 performs the sampling action. After the time point t11, the read pointer Cnt_rp of the counter 264 is gradually increased to "2". As shown in FIG. 6B, the sampling circuit 266 performs the sampling action at the time point t11. Since the read pointer Cnt_rp is "1", the sampling circuit 266 samples the flag signal fg_1 in the low level state. Moreover, at the time point t11, the gate signal Gate is switched to the low level state under control of the sampling circuit 266. That is, the gate signal Gate is closed to indicates that the effective data region ends. Since the sampling circuit 266 samples the flag signal fg_1 in the low level state, the count value Cnt_2 of the counter 262 is reset as the cleared value "0.

As mentioned above, the DDR memory system 200 has the following benefits. When the memory controller 212 issues two non-consecutive read commands, the PHY circuit 214 activates the gate signal Gate two times. Since the two non-consecutive read data can be normally latched, the possibility of losing data will be minimized.

In accordance with the present invention, the number of flag signals can be properly determined according to the lengths of the delay time. In an embodiment, four flag signals fg_0~fg_3 can be generated. After each flag signal is in the high level state, the flag signal can be maintained at the high level state for 32 (=4×8) clock cycles. In other word, if the delay time is shorter than 32 clock cycles, the design of the four flag signals fg_0~fg_3 allows for the normal operation of the DDR memory system 200. Consequently, the data loss problem is avoided.

From the above descriptions, the present invention provides a DDR memory system and a gate signal control method thereof. Regardless of whether the consecutive read commands or the non-consecutive read commands are issued from the memory controller 212, the flag generator 232 of the PHY circuit 214 sets plural flag signals fg_0~fg_3 according to the PHY clock signal CKp and the read enable signal Rd_en. When the read data from the DDR memory 220 is received, the signal generator 234 opens the gate signal Gate according to the internal data strobe signal DQS_in. Moreover, the signal generator 234 samples the plural flag signals fg_0~fg_3 to determine the timing of closing the gate signal Gate. The internal data strobe signal DQS_in is the third data strobe signal DQS_se or the fourth data strobe signal DQS_diff.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A gate signal control circuit for a DDR memory system, the DDR memory system comprising a memory controller and a DDR memory, the gate signal control circuit comprising:
   a comparing circuit connected with the DDR memory, wherein the comparing circuit receives a first data strobe signal and a second data strobe signal, and generates an internal data strobe signal;
   a flag generator connected with the memory controller, wherein the flag generator receives a physical layer clock signal and a read enable signal, and generates plural flag signals; and
   a signal generator connected with the flag generator and the comparing circuit, wherein the signal generator receives the internal data strobe signal and the plural flag signals, and generates a gate signal,
   wherein when the memory controller issues plural read commands, the flag generator sets the plural flag signals according to the physical layer clock signal and the read enable signal,
   wherein when the gate signal control circuit receives a read data from the DDR memory, the signal generator opens the gate signal according to a preamble, and the signal generator samples the plural flag signals to determine the timing of closing the gate signal.

2. The gate signal control circuit as claimed in claim 1, wherein the signal generator opens the gate signal according to the preamble of the internal data strobe signal.

3. The gate signal control circuit as claimed in claim 1, wherein the comparing circuit comprises a first comparator, wherein a first input terminal of the first comparator receives the first data strobe signal, a second input terminal of the first comparator receives a reference voltage, and an output terminal of the first comparator generates a third data strobe signal as the internal data strobe signal.

4. The gate signal control circuit as claimed in claim 1, wherein the comparing circuit comprises a second comparator, wherein a first input terminal of the second comparator receives the first data strobe signal, a second input terminal of the second comparator receives the second data strobe signal, and an output terminal of the second comparator generates a fourth data strobe signal as the internal data strobe signal.

5. The gate signal control circuit as claimed in claim 1, wherein the flag generator comprises:
   a first counter, wherein a counting terminal of the first counter receives the physical layer clock signal, and an output terminal of the first counter generates a first count value, wherein when the read enable signal is activated, the first count value is changed between a first initial value and a first target value;
   a burst end indicator receiving the first count value, wherein when the first count value is the first target value, the burst end indicator activates a burst end signal;
   a second counter, wherein a counting terminal of the second counter receives the burst end signal, and an output terminal of the second counter generates a write pointer, wherein the write pointer is changed between a second initial value and a second target value; and
   a first sampling circuit receiving the read enable signal, the burst end signal and the write pointer, wherein when the burst end signal is activated, the first sampling circuit samples the read enable signal and sets a sampling result into one of the plural flag signals corresponding to the write pointer.

6. The gate signal control circuit as claimed in claim 5, wherein the first counter is an up counter, and an enable terminal of the first counter receives the read enable signal, wherein after the first count value is gradually increased from the first initial value to the first target value, the first counter is reset and the first count value is the first initial value.

7. The gate signal control circuit as claimed in claim 5, wherein the second counter is an up counter, wherein after the write pointer is gradually increased from the second initial value to the second target value, the second counter is reset and the write pointer is the second initial value.

8. The gate signal control circuit as claimed in claim 5, wherein the signal generator comprises:
   a third counter, wherein a counting terminal of the third counter receives the internal data strobe signal, and an output terminal of the third counter generates a second count value, wherein when the third counter is enabled, the second count value is maintained at a cleared value, wherein when the preamble is generated, the second count value is changed from the cleared value to a third initial value and gradually increased to a third target value, wherein when the second count value reaches the third target value, the third counter is reset and the second count value is the cleared value or the third initial value;
   a fourth counter, wherein a counting terminal of the fourth counter receives the second count value, and an output terminal of the fourth counter generates a read pointer, wherein the read pointer is changed between the second initial value and the second target value;
   a second sampling circuit receiving the second count value and the read pointer, wherein when the second count value reaches the third target value, the second sampling circuit samples one of the plural flag signals according to the read pointer and generates a sampling signal; and
   a decision circuit receiving the sampling signal and the internal data strobe signal, wherein the decision circuit opens the gate signal according to the internal data strobe signal and determines whether the gate signal is continuously opened or closed according to the sampling signal,
   wherein the third counter resets the second count value as the cleared value or the third initial value according to the sampling signal.

9. The gate signal control circuit as claimed in claim 8, wherein when the decision circuit acquires the preamble of the internal data strobe signal, the gate signal is opened.

10. The gate signal control circuit as claimed in claim 8, wherein the fourth counter is an up counter, wherein when the read pointer is gradually increased from the second initial value to the second target value, the fourth counter is reset and the read pointer is the second initial value.

11. The gate signal control circuit as claimed in claim 1, wherein the DDR memory system further comprises a physical layer circuit, and the gate signal control circuit is included in the physical layer circuit, wherein the physical layer circuit is connected with the memory controller through a DDR physical layer Interface, and the physical layer circuit is connected with the DDR memory through a memory bus.

12. The gate signal control circuit as claimed in claim 11, wherein the physical layer clock signal and the read enable signal are transmitted through the DDR physical layer Interface, and the first data strobe signal and the second data strobe signal are transmitted through the memory bus.

\* \* \* \* \*